US011303092B2

(12) United States Patent
Dinger

(10) Patent No.: US 11,303,092 B2
(45) Date of Patent: Apr. 12, 2022

(54) RADIATION SOURCE AND DEVICE FOR FEEDING BACK EMITTED RADIATION TO A LASER SOURCE

(71) Applicant: Carl Zeiss SMT GmbH, Oberkochen (DE)

(72) Inventor: Udo Dinger, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/152,425

(22) Filed: Jan. 19, 2021

(65) Prior Publication Data

US 2021/0167569 A1     Jun. 3, 2021

Related U.S. Application Data

(63) Continuation of application No. PCT/EP2019/069679, filed on Jul. 22, 2019.

(30) Foreign Application Priority Data

Jul. 23, 2018   (DE) .......................... 102018212224.5

(51) Int. Cl.
*G03F 7/20* (2006.01)
*H01S 3/09* (2006.01)
(Continued)

(52) U.S. Cl.
CPC ...... *H01S 3/10092* (2013.01); *G03F 7/70025* (2013.01); *G03F 7/70316* (2013.01);
(Continued)

(58) Field of Classification Search
CPC .. H01S 3/10092; H01S 3/0903; H01S 3/0907; H01S 3/1305; H01S 3/08–086; H01S 5/0656; G03F 7/70025; G03F 7/70891; G03F 7/70316; G03F 7/70; G03F 7/70008; G03F 7/70041; G03F 7/7015; G03F 7/70158; G03F 7/70166; G03F 7/70175; G03F 7/70191; G03F 7/70208; G03F 7/702; G03F 7/7055;
(Continued)

(56) References Cited

U.S. PATENT DOCUMENTS 3,691,477 A * 9/1972 Janney .................... H01S 3/083
                                                          372/94
4,748,629 A * 5/1988 Edlin ..................... H01S 3/0903
                                                          372/102
(Continued)

FOREIGN PATENT DOCUMENTS

DE    10 2009 039 400 A1    3/2011
DE    10 2012 201 497 A1    1/2013
(Continued)

OTHER PUBLICATIONS

German examination report, with certified English translation, for corresponding DE Appl No. 10 2018 212 224.5, dated May 27, 2019.
(Continued)

*Primary Examiner* — Christina A Riddle
(74) *Attorney, Agent, or Firm* — Fish & Richardson P.C.

(57) ABSTRACT

An FEL includes a feedback device for feeding back emitted illumination radiation.

21 Claims, 3 Drawing Sheets

(51) Int. Cl.
*H01S 3/10* (2006.01)
*G21K 1/06* (2006.01)

(52) U.S. Cl.
CPC ......... *G03F 7/70891* (2013.01); *G21K 1/067* (2013.01); *H01S 3/0903* (2013.01)

(58) Field of Classification Search
CPC .... G03F 7/70558; G03F 7/708; G03F 7/7085; G03F 7/70908; G03F 7/70941; G21K 1/067; G21K 1/06
USPC ...... 355/52–55, 67–71, 77, 133; 378/34, 35; 250/492.1, 492.2, 492.22, 492.23, 492.3, 250/493.1, 503.1, 504 r, 505.1; 372/2
See application file for complete search history.

(56) References Cited

U.S. PATENT DOCUMENTS

| | | | | |
|---|---|---|---|---|
| 4,845,718 | A * | 7/1989 | Pistoresi | ............... H01S 3/0903 372/2 |
| 4,933,942 | A * | 6/1990 | Neil | ....... H01S 3/0903 372/102 |
| 4,941,147 | A * | 7/1990 | Bhowmik | ............... H01S 3/083 372/37 |
| 5,960,013 | A * | 9/1999 | Sheffield | ............... H01S 3/0903 372/2 |
| 6,198,793 | B1 | 3/2001 | Schulz et al. | |
| 9,007,559 | B2 | 4/2015 | Layh et al. | |
| 9,065,244 | B1 * | 6/2015 | Curtin | ................... H01S 3/0903 |
| 2002/0191650 | A1 | 12/2002 | Madey et al. | |
| 2004/0036037 | A1 | 2/2004 | Rothweiler et al. | |
| 2006/0193553 | A1 | 8/2006 | Mossberg et al. | |
| 2010/0182710 | A1 | 7/2010 | Dinger et al. | |
| 2011/0051267 | A1 | 3/2011 | Kierey et al. | |
| 2016/0225477 | A1 * | 8/2016 | Banine | ................ G03F 7/70991 |
| 2016/0252823 | A1 | 9/2016 | Patra et al. | |
| 2017/0149198 | A1 * | 5/2017 | Wakabayashi | ...... H01S 3/08009 |
| 2020/0096874 | A1 | 3/2020 | Bauer et al. | |

FOREIGN PATENT DOCUMENTS

| | | | | |
|---|---|---|---|---|
| DE | 10 2012 201 221 A1 | 8/2013 | | |
| DE | 10 2013 223 935 A1 | 5/2015 | | |
| DE | 10 2015 100 918 A1 | 7/2016 | | |
| DE | 10 2016 217 426 A1 | 8/2017 | | |
| DE | 10 2016 221 878 A1 | 11/2017 | | |
| EP | 1 072 957 A2 | 1/2001 | | |
| WO | WO 2004/038874 A2 | 5/2004 | | |
| WO | WO 2007/051638 A1 | 5/2007 | | |
| WO | WO 2009/100856 A1 | 8/2009 | | |
| WO | WO 2004/021086 A1 | 3/2011 | | |
| WO | WO-2017036717 A2 * | 3/2017 | ......... G02B 27/1093 | |
| WO | WO-2017036720 A1 * | 3/2017 | ......... G03F 7/70191 | |

OTHER PUBLICATIONS

Karen Liu and Michael G. Littman, "Novel geometry for single-mode scanning of tunable lasers", Opt. Lett. 6, 117-118 (1981).
Michael Feser et al., Lyncean Technologies Inc., https://www.euvlitho.com/2017/P17.pdf, Proc SPIE vol. 10450 1045011-2 (2017).
International Search Report for corresponding Appl No. PCT/EP2019/069679, dated Oct. 16, 2019.

* cited by examiner

RADIATION SOURCE AND DEVICE FOR FEEDING BACK EMITTED RADIATION TO A LASER SOURCE

CROSS-REFERENCE TO RELATED APPLICATIONS

The present application is a continuation of, and claims benefit under 35 USC 120 to, international application PCT/EP2019/069679, filed Jul. 22, 2019, which claims benefit under 35 USC 119 of German Application No. 10 2018 212 224.5, filed Jul. 23, 2018. The entire disclosure of these applications are incorporated by reference herein.

FIELD

The disclosure relates to a radiation source having a device for feeding back emitted radiation to a laser source, and to a device of this type. Furthermore, the disclosure relates to a method for operating a free electron laser. Moreover, the disclosure relates to an illumination system for a projection exposure apparatus or a metrology system and also a microlithographic projection exposure system and a metrology system. In addition, the disclosure relates to a method for producing a micro- or nanostructured component, and a corresponding component.

BACKGROUND

By way of example, free electron lasers (FELs) are appropriate as radiation sources for EUV projection exposure apparatuses. Such FELs usually have very large dimensions. Moreover, radioactivity may be released during the disposal of the used electron beam.

SUMMARY

The disclosure seeks to provide an improved a radiation source for a projection exposure apparatus.

The disclosure provides a device for feeding back emitted radiation to a laser source and also a radiation source having a device of this type.

The disclosure involves coupling out a part of the emitted radiation from a beam path and coupling at least one portion of the coupled-out radiation into the laser source again.

The emitted radiation can serve as illumination radiation, for example, for a projection exposure apparatus. The term illumination radiation is also used hereinafter instead of the term radiation or electromagnetic radiation. This should not be understood to be limiting. The subject matter of the present disclosure are also afforded in other applications.

With the aid of the optical components for coupling out electromagnetic radiation from the beam path and for coupling at least one portion of the coupled-out electromagnetic radiation, for example for coupling a so-called seed pulse, into the laser source, for example into a storage ring thereof, the size of the radiation source can be considerably reduced.

The electromagnetic radiation can have a wavelength of at most 30 nm, for example EUV radiation (e.g., from 5 nm to 30 nm, from 13.5 nm or 6.8 nm). Illumination radiation for operating a microlithographic projection exposure apparatus can be involved.

The laser source can be a free electron laser.

A diffractive optical element can serve for coupling out electromagnetic radiation from the beam path. The diffractive optical element can be arranged on the component for coupling out electromagnetic radiation.

With the aid of the device, an FEL can be provided with a self-seed mechanism. The device for feeding back the emitted electromagnetic radiation to the laser source can be embodied in such a way that mode matching of the coupled-in electromagnetic radiation to the electromagnetic radiation generated in the laser source is effected. For example, mode-matched coupling of seed pulses into the laser source again is effected.

In accordance with one aspect of the disclosure, the at least one optical component for coupling out electromagnetic radiation from the beam path and/or the at least one optical component for coupling electromagnetic radiation into the laser source include(s) in each case a grazing incidence mirror (GI mirror).

Expansion of the illumination beam can be achieved via a grazing incidence mirror. This can be used to reduce the thermal load on the optical components.

The angle of incidence (grazing angle) can be less than 15° (e.g., less than 10°). It can be 0.1 rad=5.7°, for example.

The mirror of the component for coupling out electromagnetic radiation from the beam path can be superpolished. In the used range it has an integral figure error of at most 10 nm rms (e.g., 2.5 nm rms) (root mean square) for spatial wavelengths of greater than 1 mm, up to the free aperture of the mirror and an integral rms roughness of at most 1 nm (e.g., 0.5 nm rms) for spatial frequencies of between 10 nm and 1 mm. In accordance with a further aspect of the disclosure, the mirror of the optical component for coupling out electromagnetic radiation is arranged at a distance of at least 1 m (e.g., at least 2 m, at least 5 m, at least 8 m) from the output of the laser source. The distance is preferably at most 30 m (e.g., at most 20 m, at most 12 m).

The optical component of the device for feeding back electromagnetic radiation that can be downstream of the optical component for coupling out electromagnetic radiation at a distance of at least 1 m (e.g., at least 2 m, at least 3 m, at least 5 m, at least 8 m) and/or at most 30 m (e.g., at most 20 m, at most 12 m) from the GI mirror in the forward direction. This can influence firstly the expansion of the coupled-out illumination beam, and secondly the transverse distance between the returning beam and the outgoing beam.

In accordance with a further aspect of the disclosure, the GI mirror of the optical component for coupling out electromagnetic radiation is embodied can be a convex mirror (e.g., to a first approximation off-axis paraboloid mirror or as an ellipsoidal mirror), for example having a beam waist at a focal point (e.g., a hyperboloid mirror, a freeform surface mirror).

In accordance with a further aspect of the disclosure, the mirror of the component for coupling the electromagnetic radiation into the laser source, apart from the diffractive structure, is embodied substantially identically to the mirror of the optical component for coupling out electromagnetic radiation.

In accordance with a further aspect of the disclosure, the diffractive optical element is embodied as drivable. For example, a controllable grating element is involved. By way of example, an acousto-optical element can be involved. For details, reference should be made to DE 10 2016 217 426 A1.

The diffractive optical element can have a variable grating constant, such as a controllable grating constant. This can make possible variable, for example controllable, power feedback to the FEL.

As an alternative thereto, the diffractive optical element can also be embodied as a static grating. This can enable a particularly simple implementation of the disclosure.

The diffractive optical element can have at least 30 lines per millimetre (e.g., at least 38 lines per millimetre). The line density can be less than 100 lines per millimeter. As a result, it is possible to separate two adjacent orders at the optical element (M2) downstream of the diffractive optical element by at least the beam diameter.

In accordance with a further aspect of the disclosure, the diffractive optical element can be embodied in a blazed fashion (blazed grating). It is thereby possible to concentrate the reflected power in a few orders, for example in two orders.

In accordance with a further aspect of the disclosure, provision is made for using the zero order or a higher order as a seed pulse for coupling into the laser source again.

In accordance with a further aspect of the disclosure, the diffractive optical element has lines perpendicular to the beam direction.

As an alternative thereto, the diffractive optical element can have lines in the beam direction. It can be embodied as a conical grating, for example. Details concerning the design can be gathered from WO2004/021086 A1 and DE 10 2012 201 497 A1. A conical grating diffracts the orders of diffraction which are different than zero out of the plane of incidence, i.e. with a directional component in the direction of the grating vector. A (conventional) grating having lines perpendicular to the light direction diffracts within the plane of incidence. Depending on structural space conditions, an optimum design can be achieved by way of appropriate choice.

In accordance with a further aspect of the disclosure, at least one of the grazing incidence mirrors is produced from silicon carbide, silicon, copper, ruthenium, aluminum or diamond or includes constituents of these substances or compounds or alloys thereof. The grazing incidence mirror be formed of the aforementioned substances or compounds thereof or a combination of same.

In accordance with a further aspect of the disclosure, the at least one optical component having the diffractive optical element includes a cooling unit. The component can be internally cooled, for example. A selection from water, oil, carbon dioxide or nitrogen can serve as cooling medium. Examples for the integration of a cooling unit can be gathered from, for example, WO2007/051638A1, US2010/0182710A1 or U.S. Pat. No. 9,007,559B2 or DE 10 2012 201 221 A1, DE 10 2015 100 918 A1, DE 10 2009 039400 A1, DE 10 2016 221 878 A1.

In accordance with a further aspect of the disclosure, the device for feeding back electromagnetic radiation to the laser source includes two grazing incidence mirrors and two normal incidence mirrors (NI mirrors).

The device includes, for example, in each case exactly two GI mirrors and two NI mirrors.

It has been found that this has enabled the thermal load on the individual mirrors to be kept below a predefined limit value, for example below 1000 W/cm$^2$ (e.g., below 500 W/cm$^2$, below 300 W/cm$^2$, below 200 W/cm$^2$). In accordance with a further aspect of the disclosure, the mirrors of the device are arranged symmetrically, for example mirror-symmetrically, with respect to a center plane. Optionally, the device overall has a symmetrical construction. This can facilitate mode-matched coupling of the electromagnetic radiation, for example of the seed pulses, in again.

The features of a radiation source having a feedback device in accordance with the preceding description are evident from those already described.

The radiation source can be an EUV radiation source, i.e., a radiation source for generating electromagnetic radiation in the EUV wavelength range.

The disclosure also seeks to provide an improved method for operating a free electron laser.

In an aspect, the disclosure provides a method in which a part of the electromagnetic radiation generated by the FEL is coupled out from the beam path and at least partly coupled into the FEL again.

Provision is made, for example, for coupling seed pulses into the FEL again.

The coupling in again can be effected in a mode-matched manner.

The disclosure provides a compact-storage-ring-based FEL which is operated far below saturation (approximately <1% of the saturation power), with the result that the degradation of the electron beam quality owing to the FEL process is kept so low that it becomes possible to store the electron beam.

Details concerning the design of this FEL can be gathered from the publications of Lyncean Technologies Inc. Michael Feser, https://www.euvlitho.com/2017/P17.pdf and Michael Feser et al., Proc SPIE Vol 10450 1045011-2 (2017).

The total EUV power which can be in the kilowatts range can arise as a result of a high repetition rate. The repetition rate can be at least 5 Hz (e.g., at least 10 Hz, at least 20 Hz, at least 30 Hz, at least 50 Hz, at least 100 Hz, at least 200 Hz, at least 300 Hz). It is usually less than 1 GHz.

Optionally, a plurality of pulses (e.g., at least 5 pulses, at least 10 pulses, at least 20 pulses, at least 30 pulses, at least 50 pulses) can be stored in the storage ring.

Since the electrons can be stored for a long period of time, the number of electrons to be disposed of can decrease dramatically. The issue with respect to protection against radiation is thus simplified as well.

The power of that portion of the coupled-out electromagnetic radiation which is coupled in again can be at least 10 W (e.g., at least 20 W, at least 30 W, at least 50 W, at least 100 W), and/or less than 1 kW (e.g., less than 500 W, less than 300 W, less than 200 W).

In accordance with a further aspect of the disclosure, the exact value of the power coupled in again can be controlled by the control of the diffractive optical element. The flexibility of the feedback can be improved as a result.

In accordance with a further aspect of the disclosure, provision is made for controlling, for example by closed-loop control, the electromagnetic radiation used for illuminating the object field, for example the intensity of the electromagnetic radiation, by driving the diffractive optical element. It is possible, for example, to control, for example by closed-loop control, the electromagnetic radiation used for imaging the reticle on a wafer in the image field of the projection optical unit, for example the intensity of the electromagnetic radiation, by driving the diffractive optical element.

Using suitable feedback and/or feedforward information, it is possible to realize dose control at the reticle and/or wafer level.

Further aspects of the disclosure include improving an illumination system for a projection exposure system or a metrology system and also a projection exposure system and a metrology system having a corresponding illumination system.

The disclosure provides an illumination system having a radiation source in accordance with the description above. The features are evident from those already described.

With the aid of the illumination system, it is possible, for example, to feed back a part of the electromagnetic radiation generated by the FEL to the latter for seeding purposes. The orders of diffraction which are not used for seeding can be guided without obscuration to one or more scanners of the projection exposure system, for example to one or more projection optical units. For details of a corresponding projection exposure system, reference should again be made to DE 10 2016 217 426 A1.

Further features of the disclosure include improving a method for producing a micro- or nanostructured component and also a component of this type.

The disclosure provides a projection exposure system according to the description above.

BRIEF DESCRIPTION OF THE DRAWINGS

Further features and details of the disclosure will become apparent from the description of exemplary embodiments with reference to the figures, in which.

DETAILED DESCRIPTION

Figure 1:
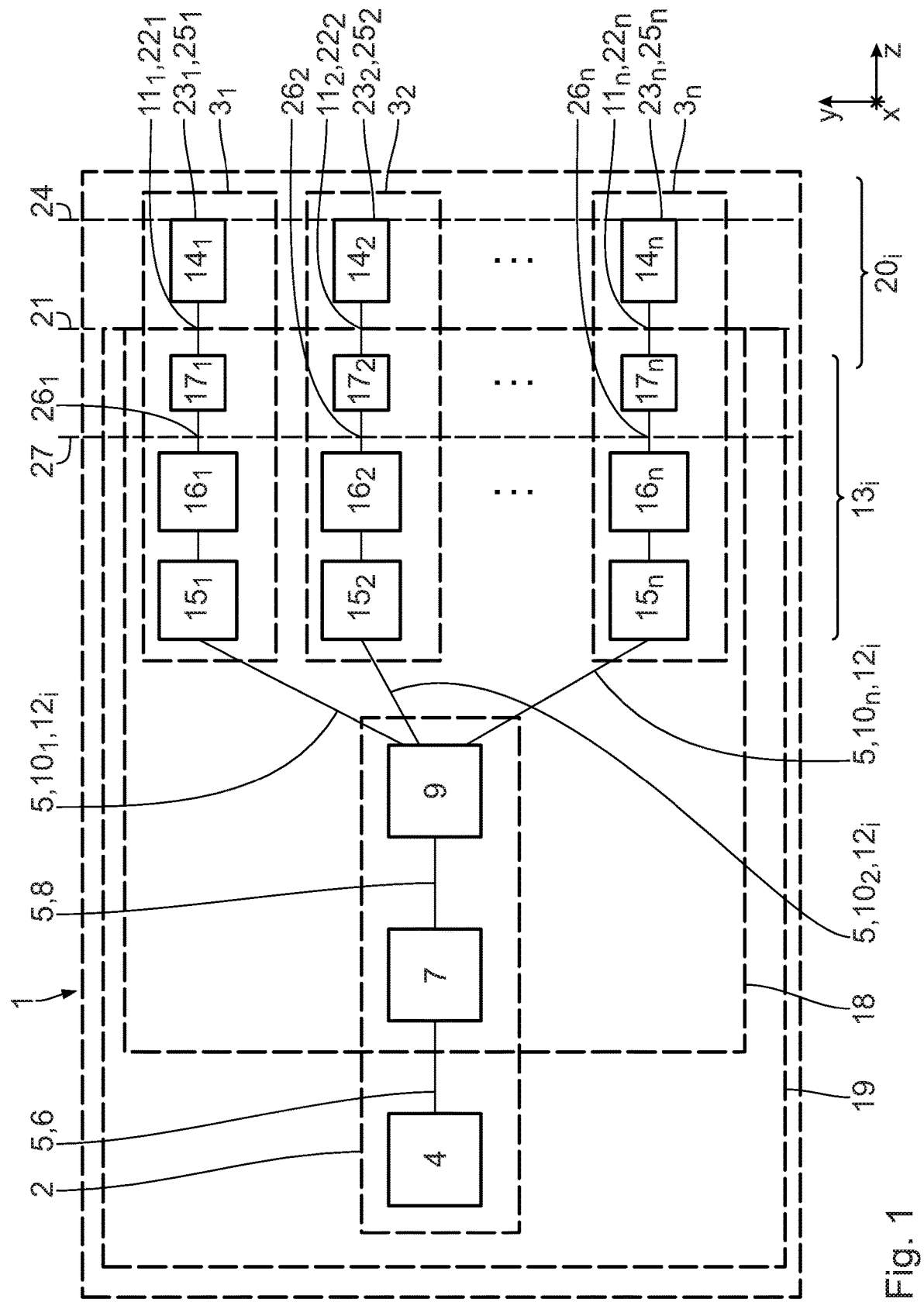
FIG. 1 schematically shows the basic construction of a projection exposure system having a plurality of n scanners, FIG. 2 schematically shows an alternative illustration of the beam path in the projection exposure system in accordance with FIG. 1, and FIG. 3 schematically shows a detail view of the radiation source module of the projection exposure system in accordance with FIG. 1 with a device for feeding back illumination radiation.
Figure 2:
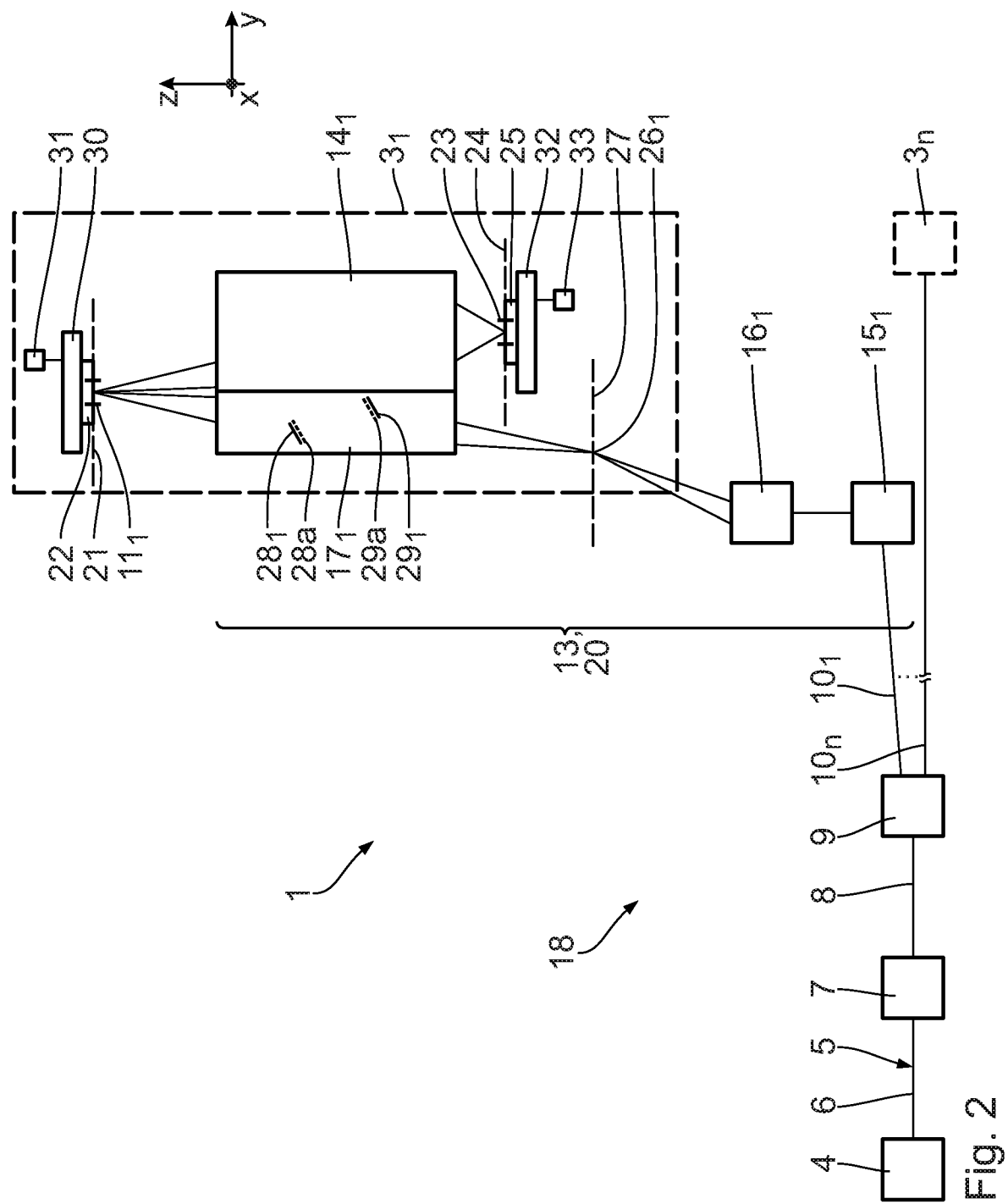

Firstly, certain constituent parts of a projection exposure system 1 will be described below with reference to FIGS. 1 and 2. The description of the general construction of the projection exposure system should be understood to be by way of example and not limiting. For further details, reference should be made to the description of DE 10 2016 217 426 A1 as a representative, which is hereby fully incorporated in the present disclosure as part thereof. In particular, the output coupling and/or beam expanding optical units disposed downstream of the radiation source module 2 can be embodied differently than is illustrated in FIGS. 1 and 2.

The subdivision of the projection exposure system 1 into subsystems that is carried out below serves primarily for the conceptual demarcation thereof. The subsystems can form separate structural subsystems. However, the division into subsystems need not necessarily be reflected in a structural demarcation.

The projection exposure system 1 includes a radiation source module 2 and one or a plurality of scanners $3_i$.

The radiation source module 2 includes a radiation source 4 for generating illumination radiation 5.

The radiation source 4 is a free electron laser (FEL), for example.

The radiation source 4 has for example an average power in the range of 1 kW to 25 kW. It has a pulse frequency in the range of 10 MHz to 10 GHz. Each individual radiation pulse can amount to an energy of 83 µJ for example. Given a radiation pulse length of 100 fs, this corresponds to a radiation pulse power of 833 MW.

The radiation source 4 can also have a repetition rate in the kilohertz range, for example of 100 kHz, or in the low megahertz range, for example at 3 MHz, in the medium megahertz range, for example at 30 MHz, in the upper megahertz range, for example at 300 MHz, or even in the gigahertz range, for example at 1.3 GHz.

The radiation source 4 is an EUV radiation source, for example. The radiation source 4 emits in particular radiation having a wavelength of at most 30 nm, in particular EUV radiation in the wavelength range of, for example, between 2 nm and 30 nm, in particular between 2 nm and 15 nm.

The radiation source 4 emits the illumination radiation 5 in the form of a raw beam 6. The raw beam 6 has a very small divergence. The divergence of the raw beam 6 can be less than 10 mrad, in particular less than 1 mrad, in particular less than 100 µrad, in particular less than 10 µrad. To facilitate the description of positional relationships, coordinates of a Cartesian xyz-coordinate system are used below. The x-coordinate together with the y-coordinate regularly spans a beam cross section of the illumination radiation 5. The z-direction regularly runs in the radiation direction of the illumination radiation 5. In the region of the object plane 21 and of the image plane 24, respectively, the y-direction runs parallel to a scan direction. The x-direction runs perpendicular to the scan direction. The raw beam 6 is emitted in a specific direction by the radiation source 4. The direction is also designated hereinafter as pointing P.

The raw beam 6 can have an etendue that is less than 0.1 mm$^2$, in particular less than 0.01 mm$^2$. The etendue is the smallest volume of a phase space which contains 90% of the energy of the illumination radiation 5 emitted by the radiation source 2. Definitions of the etendue corresponding thereto can be found for example in EP 1 072 957 A2 and U.S. Pat. No. 6,198,793 B1.

The radiation source module 2 furthermore includes a beam shaping optical unit 7 disposed downstream of the radiation source 4. The beam shaping optical unit 7 serves for generating a collective output beam 8 from the raw beam 6. The collective output beam 8 has a very small divergence. The divergence of the collective output beam 8 can be less than 10 mrad, in particular less than 1 mrad, in particular less than 100 µrad, in particular less than 10 µrad.

In particular, the diameter of the raw beam 6 or of the collective output beam 8 can be influenced via the beam shaping optical unit 7. In particular, an expansion of the raw beam 6 can be achieved via the beam shaping optical unit 7. The raw beam 6 can be expanded via the beam shaping optical unit 7 in particular by a factor of at least 1.5, in particular at least 2, in particular at least 3, in particular at least 5, in particular at least 10. The expansion factor is in particular less than 1000. It is also possible to expand the raw beam 6 to different extents in different directions. In particular, it can be expanded to a greater extent in an x-direction than in a y-direction. In this case, the y-direction in the region of the object field $11_i$ corresponds to the scan direction. The divergence of the collective output beam 8 can be less than the divergence, in particular less than half the divergence, of the raw beam 6.

For further details of the beam shaping optical unit 7, reference should be made to DE 10 2013 223 935 A1, which is hereby incorporated into the present application. The beam shaping optical unit 7 can include, in particular, one or two beam shaping mirror groups each having two mirrors. The beam shaping mirror groups serve, in particular, for the beam shaping of the collective output beam 8 in mutually perpendicular planes which run parallel to the propagation direction of the collective output beam 8.

The beam shaping optical unit 7 can also include further beam shaping mirrors.

The beam shaping optical unit 7 can include in particular cylindrical mirrors, in particular at least one convex and at least one concave cylindrical mirror. It can also include mirrors having a freeform profile. Such mirrors have in each case a height profile which is not representable as a conic section.

In addition, the intensity profile of the raw beam 6 can be influenced via the beam shaping optical unit 7.

Moreover, the radiation source module 2 includes an output coupling optical unit 9, described in even greater detail below. The output coupling optical unit 9 serves for generating a plurality of, namely n, individual output beams $10_i$ (i=1 to n) from the collective output beam 8. The individual output beams $10_i$ in each case form beams for illuminating an object field $11_i$. The individual output beams $10_i$ are in each case assigned to one of the scanners $3_i$. The beams of the individual output beams $10_i$ can in each case include a plurality of separate partial beams $12_i$.

As will be described in even greater detail below, the functionality of the beam shaping optical unit 7 can be integrated into the output coupling optical unit 9. In this case, a separate beam shaping optical unit 7 can be dispensed with.

In the case of the alternative in accordance with FIG. 2, the output coupling optical unit 9 is arranged downstream of the beam shaping optical unit 7 in the direction of propagation of the illumination radiation. Preferably, the output coupling optical unit 9 is arranged directly downstream of the radiation source 4, in particular before the raw beam 6 is influenced via the beam shaping optical unit 7. In this case, provision can be made of separate beam shaping optical units for each of the individual output beams $10_i$. Such arrangement of the output coupling optical unit 9 makes it possible to reduce radiation losses on account of damping at the output coupling optical unit 9.

The radiation source module 2 is arranged in an evacuatable housing, in particular.

The scanners $3_i$ in each case include a beam guiding optical unit $13_i$ and a projection optical unit $14_i$.

The beam guiding optical unit $13_i$ serves for guiding the illumination radiation 5, in particular the respective individual output beams $10_i$, to the object fields $11_i$ of the individual scanners $3_i$.

The projection optical unit $14_i$ serves in each case for imaging a reticle $22_i$ arranged in one of the object fields $11_i$ into an image field $23_i$, in particular onto a wafer $25_i$ arranged in the image field $23_i$.

The beam guiding optical unit $13_i$ includes, in the order of the beam path of the illumination radiation 5, in each case a deflection optical unit $15_i$, an input coupling optical unit $16_i$, in particular in the form of a focusing assembly, and an illumination optical unit $17_i$. The input coupling optical unit $16_i$ can in particular also be embodied as a Wolter type III collector.

The deflection optical unit $15_i$ can also be integrated into the output coupling optical unit 9. The output coupling optical unit 9 can be embodied in particular in such a way that it already deflects the individual output beams $10_i$ in a desired direction. In accordance with one variant, the deflection optical units $15_i$ in their entirety can also be dispensed with. Generally, the output coupling optical unit 9 and the deflection optical units $15_i$ can form an output coupling-deflection device.

For different variants of the deflection optical units $15_i$, reference should be made to DE 10 2013 223 935 A1, for example, which is hereby incorporated in the present application as part thereof.

The input coupling optical unit $16_i$ serves in particular for coupling in the illumination radiation 5, in particular one of the individual output beams $10_i$ generated by the output coupling optical unit 9, into a respective one of the illumination optical units $17_i$.

The beam guiding optical unit $13_i$ together with the beam shaping optical unit 7 and the output coupling optical unit 9 form constituent parts of an illumination device 18.

The illumination device 18, just like the radiation source 4, is part of an illumination system 19.

Each of the illumination optical units $17_i$ is respectively assigned one of the projection optical units $14_i$. Together the illumination optical unit $17_i$ and the projection optical unit $14_i$ assigned to one another are also referred to as an optical system $20_i$.

The illumination optical unit $17_i$ serves in each case for transferring illumination radiation 5 to a reticle $22_i$ arranged in the object field $11_i$ in an object plane 21. The projection optical unit $14_i$ serves for imaging the reticle $22_i$, in particular for imaging structures on the reticle $22_i$, onto a wafer $25_i$ arranged in an image field $23_i$ in an image plane 24.

The illumination optical unit $17_i$ in each case includes a first facet mirror $28_i$ and a second facet mirror $29_i$, the function of which corresponds in each case to that of the facet mirrors known from the prior art. The first facet mirror $28_i$ can be a field facet mirror, in particular. The second facet mirror $29_i$ can be a pupil facet mirror, in particular. However, the second facet mirror $29_i$ can also be arranged at a distance from a pupil plane of the illumination optical unit 17. This general case is also referred to as specular reflector.

The facet mirrors $28_i$, $29_i$ each include a multiplicity of facets 28a, 29a. During the operation of the projection exposure system 1, each of the first facets 28a is respectively assigned one of the second facets 29a. The facets 28a, 29a assigned to one another in each case form an illumination channel of the illumination radiation 5 for illuminating the object field 11 at a specific illumination angle.

The facets 28a of the first facet mirror $28_i$ can be embodied such that they are displaceable, in particular tiltable, in particular with two degrees of freedom of tilting in each case. The facets 28a of the first facet mirror $28_i$ can be embodied as virtual facets. This should be understood to mean that they are formed by a variable grouping of a plurality of individual mirrors, in particular a plurality of micromirrors. For details, reference should be made to WO 2009/100856 A1, which is hereby incorporated in the present application as part thereof.

The facets 29a of the second facet mirror $29_i$ can correspondingly be embodied as virtual facets 29a. They can also correspondingly be embodied such that they are displaceable, in particular tiltable.

The reticle 22 having structures that are reflective for the illumination radiation 5 is carried by a reticle holder 30. The reticle holder 30 is displaceable in a manner driven via a displacement device 33.

The wafer 25 is held by a wafer holder 32. The wafer holder 32 is displaceable in a manner controlled via a displacement device 33.

The displacement device 31 of the reticle holder 30 and the displacement device 33 of the wafer holder 32 can be signal-connected to one another. They are synchronized, in particular. The reticle 22 and the wafer 25 are displaceable in particular in a synchronized manner with respect to one another.

During projection exposure for producing a micro- or nanostructured component, both the reticle 22 and the wafer 25 are displaced in a synchronized manner, in particular scanned in a synchronized manner, by the corresponding driving of the displacement devices 31 and 33. The wafer 25 is scanned at a scan rate of 600 mm/s, for example, during projection exposure.

The projection exposure system 1 includes in particular at least two, in particular at least three, in particular at least four, in particular at least five, in particular at least six, in particular at least seven, in particular at least eight, in particular at least nine, in particular at least ten, scanners $3_i$. The projection exposure system 1 can include up to twenty scanners $3_i$.

The scanners $3_i$ are supplied with illumination radiation 5 by the common radiation source module 2, in particular the common radiation source 4.

The projection exposure system 1 serves for producing micro- or nanostructured components, in particular electronic semiconductor components.

The input coupling optical unit $16_i$ is arranged in the beam path between the radiation source module 2, in particular the output coupling optical unit 9, and a respective one of the illumination optical units $17_i$. It is embodied in particular as a focusing assembly. It serves for transferring a respective one of the individual output beams $10_i$ into an intermediate focus $26_i$ in an intermediate focal plane 27. The intermediate focus $26_i$ can be arranged in the region of a through opening of a housing of the optical system $20_i$ or of the scanner $3_i$. The housing is evacuatable, in particular.

The illumination optical unit $17_i$ in each case includes a first facet mirror and a second facet mirror, the function of which corresponds in each case to that of the facet mirrors known from the prior art. The first facet mirror can be a field facet mirror, in particular. The second facet mirror can be a pupil facet mirror, in particular. However, the second facet mirror can also be arranged at a distance from a pupil plane of the illumination optical unit $17_i$. This general case is also referred to as specular reflector.

The facet mirrors in each case include a multiplicity of first and second facets, respectively. During the operation of the projection exposure system 1, each of the first facets is respectively assigned one of the second facets. The facets assigned to one another in each case form an illumination channel of the illumination radiation 5 for illuminating the object field $11_i$ at a specific illumination angle.

The channel-by-channel assignment of the second facets to the first facets is carried out depending on a desired illumination, in particular a predefined illumination setting. The facets of the first facet mirror can be embodied such that they are displaceable, in particular tiltable, in particular with two degrees of freedom of tilting in each case. The facets of the first facet mirror are switchable in particular between different positions. In different switching positions they are assigned to different second facets from among the latter. At least one switching position of the first facets can in each case also be provided in which the illumination radiation 5 impinging on them does not contribute to the illumination of the object field $11_i$. The facets of the first facet mirror can be embodied as virtual facets. This should be understood to mean that they are formed by a variable grouping of a plurality of individual mirrors, in particular a plurality of micromirrors. For details, reference should be made to WO 2009/100856 A1, which is hereby incorporated in the present application as part thereof.

The facets of the second facet mirror can correspondingly be embodied as virtual facets. They can also correspondingly be embodied such that they are displaceable, in particular tiltable.

Via the second facet mirror and, if appropriate, via a downstream transfer optical unit (not illustrated in the figures), which includes three EUV mirrors, for example, the first facets are imaged into the object field $11_i$ in the reticle or object plane 21.

The individual illumination channels lead to the illumination of the object field $11_i$ at specific illumination angles. The totality of the illumination channels thus leads to an illumination angle distribution of the illumination of the object field $11_i$ by the illumination optical unit $17_i$. The illumination angle distribution is also referred to as illumination setting.

In a further embodiment of the illumination optical unit $17_i$, in particular given a suitable position of the entrance pupil of the projection optical unit $14_i$, it is also possible to dispense with the mirrors of the transfer optical unit upstream of the object field $11_i$, which leads to a corresponding increase in transmission for the used radiation beam.

The reticle $22_i$ having structures that are reflective to the illumination radiation 5 is arranged in the object plane 21 in the region of the object field $11_i$.

The projection optical unit $14_i$ in each case images the object field $11_i$ into the image field $23_i$ in the image plane 24. The wafer $25_i$ is arranged in the image plane 24 during the projection exposure. The wafer $25_i$ has a light-sensitive coating that is exposed during the projection exposure via the projection exposure system 1.

One advantageous embodiment of the illumination system 19 is described below.

It has been recognized that a free electron laser (FEL) or a synchrotron-based radiation source can advantageously be used as the main radiation source 4. An FEL scales very well, that is to say that it can be operated particularly economically in particular if it is designed to be large enough to supply a plurality of scanners $3_i$ with illumination radiation 5. The FEL can supply in particular up to eight, ten, twelve or even twenty scanners with illumination radiation 5.

On the other hand, it may be advantageous to provide compact and thus more cost-effective FELs that each pass illumination radiation just to a single scanner. This holds true in particular if just single scanners are installed in the EUVL factories. This is the application principally to which the storage-ring-based FELs are directed which are the subject matter of this disclosure without being restricted thereto.

It is also possible for more than one radiation source 4 to be provided.

A desirable property of the projection exposure system 1 is that the radiation intensity that reaches the individual reticles $22_i$ and in particular the radiation dose that reaches the wafers $25_i$ can be regulated very exactly and very rapidly. The radiation dose that reaches the wafers $25_i$ is intended to be able to be kept as constant as possible, in particular.

Fluctuations of the illumination radiation 5 impinging on the reticle $22_i$, in particular of the total intensity of the illumination radiation 5 impinging on the reticles $22_i$, and thus of the radiation dose impinging on the wafers $25_i$ can be attributable to intensity fluctuations of the main radiation source and/or to geometric fluctuations, in particular to fluctuations of the direction of the raw beam 6 emitted by the main radiation source 4 and/or fluctuations of the cross-sectional profile, in particular in the region of the output coupling optical unit 9, of the raw beam. Fluctuations of the cross-sectional profile can be attributable in particular to divergence fluctuations of the raw beam 6 emitted by the radiation source 4 and/or of the collective output beam 8.

Figure 3:
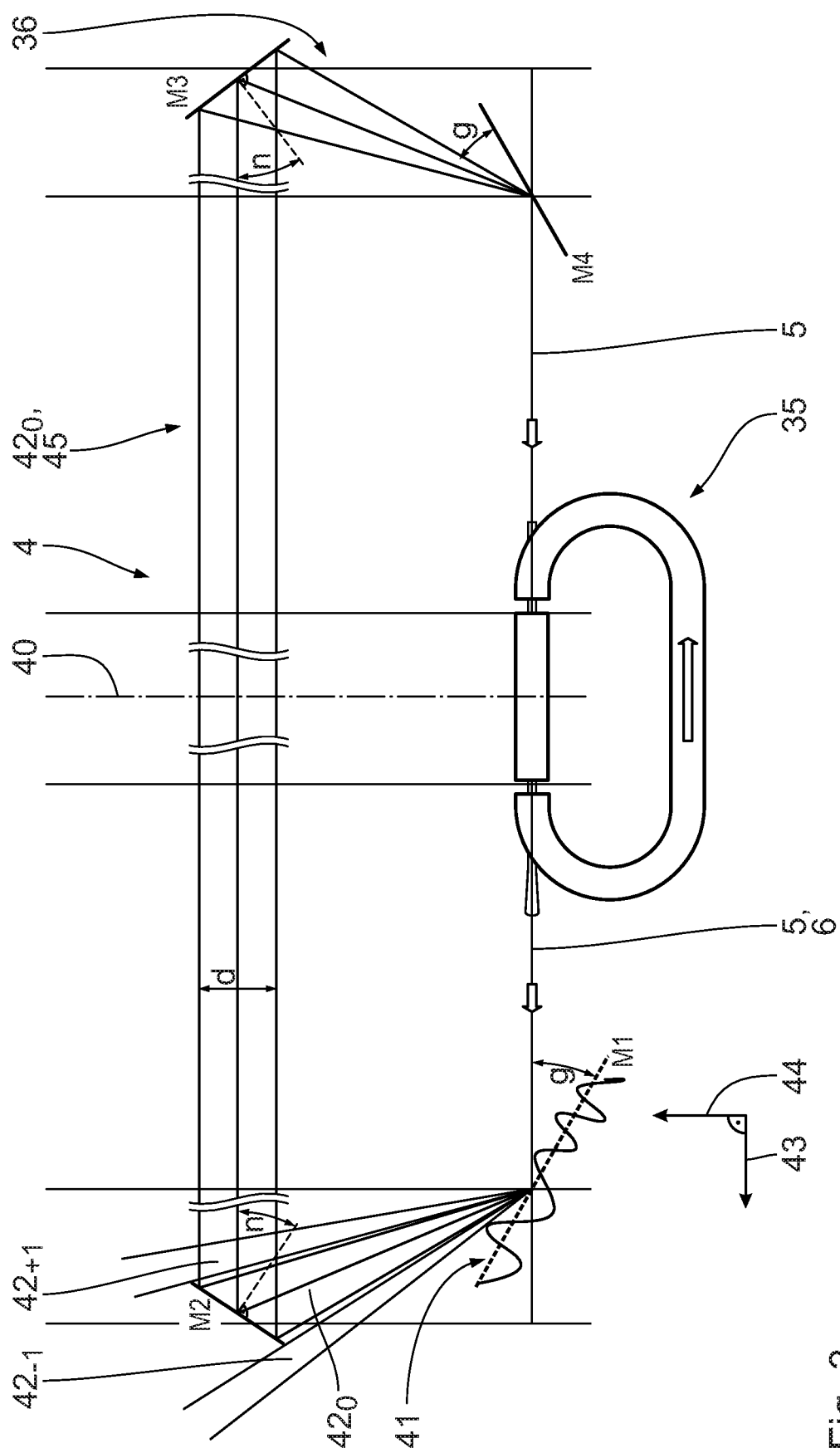

Details of the radiation source module 2, in particular of the radiation source 4, are described below with reference to FIG. 3. The radiation source 4 includes the free electron laser 35 (FEL). The general construction of the compact FEL 35 is known. As a representative in this regard reference is made to the publications of Lyncean Technologies Inc. Michael Feser, https://www.euvlitho.com/2017/P17.pdf and Michael Feser et al., Proc SPIE Vol 10450 1045011-2 (2017). These publications also reveal the importance of the constituent parts of the FEL 35 that are only illustrated schematically in FIG. 3.

The FEL 35 emits the illumination radiation 5. The FEL 35 emits, in particular, illumination radiation 5 having a wavelength of at most 30 nm, in particular having a wavelength in accordance with the description above.

In addition, the radiation source 4 includes a device 36 for feeding back illumination radiation 5 to the FEL 35.

The device 36 includes four mirrors M1, M2, M3 and M4 in the order of the beam path of the illumination radiation 5.

The mirrors M1 to M4 are preferably arranged symmetrically with respect to a center plane 40.

The mirrors M1 and M4 are grazing incidence mirrors (GI mirrors). Illumination radiation 5 impinges on them at an angle of incidence g (grazing angle) of approximately 6°.

The mirrors M2 and M3 are normal incidence mirrors (NI mirrors).

The angle of incidence n is, in particular, approximately 6°.

A diffractive optical element, in particular in the form of a grating structure 41, is arranged on the first mirror M1. This can be a blazed grating, in particular. As an alternative thereto, an acousto-optical element can serve as grating structure 41. For details of such an acousto-optical element, reference should be made to DE 10 2016 217 426 A1.

The mirror M1 with the grating structure 41 forms a mechanism for coupling out a part of the illumination radiation 5 from the raw beam 6 or the collective output beam 8. Provision is made, in particular, for guiding only one specific order of diffraction 42 of the illumination radiation 5 diffracted at the grating structure 41 to the mirror M2, while all other orders of diffraction are passed on to one or more of the scanners $3_i$.

The mirror with the grating structure 41 can be regarded in particular as part of the beam shaping optical unit 7 and of the output coupling optical unit 9. It can form in particular a part of a combined beam shaping and output coupling optical unit.

Preferably, the zero order of diffraction $42_0$ is guided to the mirror M2. The first order of diffraction $42_{+1}$ and the −1st order of diffraction $42_{-1}$ are guided to two of the scanners $3_i$, $3_j$. Alternatively, the higher orders of diffraction can be collected again by a suitable optical unit and be fed to a single scanner.

Using suitable blazing of the grating structure 41, the reflected power can be concentrated in a few orders of diffraction, preferably in two orders of diffraction.

The mirror M2 guides the coupled-out part of the illumination radiation 5, in particular the zero order of diffraction $42_0$, to the third mirror M3.

The third mirror M3 passes the coupled-out illumination radiation 5 on to the fourth mirror M4. From there the illumination radiation 5 is coupled into the FEL 35 again in the circulation direction of the electron beam.

The direction in which the raw beam 6 leaves the FEL 35 is referred to as the forward direction 43. The direction perpendicular thereto is referred to as the transverse direction 44. These directions are depicted schematically in FIG. 3.

The mirror M1 is arranged at a distance of approximately 10 m from the output of the FEL 35 in the forward direction 43.

The mirror M2 is at a distance of likewise approximately 10 m from the mirror M1 in the forward direction 43. The distance between the mirrors M1 and M2 in the transverse direction 44 is approximately 2 m.

The distance between the mirrors M2 and M3 in the forward direction is approximately −52 m.

The mirror M1 is superpolished. It has, in particular, an EUV-compatible figure error and an EUV-compatible roughness. The figure error of the mirror M1 is—at a wavelength of 13.5 nm—at most 2.5 nm rms, and the roughness is at most 1 nm rms. The mirror M4, apart from the grating structure 41, is constructed substantially identically to the mirror M1.

The mirrors M2 and M3 have—at a wavelength of 13.5 nm—a figure error of at most 0.25 nm rms.

The permissible figure errors typically scale with the wavelength, and the permissible roughnesses scale with the square of the wavelengths.

All of the mirrors M1, M2, M3 and M4 can be coated in order to achieve the highest possible reflectivity. The NI mirrors M2 and M3 have a reflectivity of at least 60%, preferably 70%, at a wavelength of 13.5 nm.

The GI mirrors M1 and M4 can have a coating, in particular a ruthenium coating. The reflectivity of the NI mirrors M1 and M4 at a wavelength of 13.5 nm can be increased to 94% as a result.

The material and achievable reflectivity of the coatings are dependent on the exposure wavelength. By way of example, Mo/Si-based multilayer structures are used at 13.5 nm, while La/B-based multilayer structures are more readily used at 6.8 nm.

The abovementioned indications conserving the roughness and the figure error of the mirrors relate to illumination radiation having a wavelength of 13.5 nm. In the case of illumination radiation having a different wavelength, for example of 6.8 nm, the values may deviate from those mentioned above. The permissible grazing angles are also dependent on the wavelength of the illumination radiation. They likewise decrease as the wavelength becomes shorter.

Upon impinging on the first mirror M1, the illumination radiation 5 has a beam diameter of approximately 2 mm. Given a grazing angle of 0.1 rad=5.7°, the beam on the mirror M1 is expanded to approximately 20 mm in the forward direction 43.

The beam diameter on the mirror M2 is approximately 50 mm. The thermal load per unit area is considerably reduced as a result.

M1 can be embodied as a convex, to a first approximation off-axis paraboloidal mirror. It can also be embodied as an ellipsoid, in particular with the beam waist at a focal point, or as a hyperboloid or as a freeform surface. The freeform surface can be approximated by toroids, in particular.

The grating structure 41 includes grating lines, which can be oriented either normal to the beam direction or in the beam direction. In particular, a conical grating having lines in the beam direction can serve as the grating structure 41.

With the aid of the grating structure, a portion of the illumination radiation 5 that is appropriate to the seed line is coupled out into the zero order $42_0$, which forms the used order in this example. The remaining orders $42_i$, $|i| \geq 1$, are passed on to the scanners $3_i$.

As already mentioned, the grating structure 41 can be embodied as a dynamic grating. This enables the portion of the coupled-out illumination radiation to be controlled, in particular by closed-loop control.

In order that the orders of diffraction $42_i$, $|i| \geq 1$, which are not used for seeding can be passed on without obscuration, two adjacent orders at the mirror M2 have to be separated from one another by at least the beam diameter. This can be achieved—at wavelength of 13.5 nm—if the grating structure 41 has approximately 38 lines per millimeter. M2 and M3 are preferably designed as concave mirrors. They can be embodied to a first approximation as off-axis paraboloidal mirrors. It is thereby possible to generate a parallel beam 45 in the region between M2 and M3. The beam 45 has a diameter d of approximately 5 cm.

The mirror M3 receives the beam 45 and focuses it onto the mirror M4.

All of the mirrors M1, M2, M3 and M4 are embodied as multilayer mirrors having a multilayer structure.

For a seeding power of 50 W, an output power of the FEL 35 of 1179 W is used with the feedback device 36 described above. The maximum thermal load on the components of the device 36 is less than 180 W/cm² in this case. It arises at the mirror M1. The thermal load can be further reduced by reducing the grazing angle g and/or by increasing the distance between the mirror M1 and the output of the FEL 35.

Preferably, the mirror M1 is produced from materials having a high thermal loading capacity, in particular thermally conductive materials. The mirror M1 can be produced in particular from silicon carbide, silicon, copper, ruthenium, aluminum or diamond. A solid ruthenium mirror can also serve as the mirror M1. A cooling unit (not illustrated in the figures) can be provided for cooling the mirror M1.

The feedback device 36 is embodied in such a way that the seed pulse in the undulator passes parallel to the electron beam of the FEL 35. The undesired generation of high-energy x-ray radiation as a result of coherent inverse Compton scattering of light and electron radiation passing antiparallel is avoided as a result.

Using an accurate adaptation of the distances between the mirrors M1, M2, M3 and M4 or via an adaptation of the propagation time of the illumination radiation 5 in the feedback loop, it is possible to achieve a synchronization with the pulses circulating in the FEL 35.

Further details of the device 36 and of the operation of the radiation source 4 having the device 36 are described as a brief outline below.

The pulse coupled into the FEL 35 again via the device 36 is matched to the laser mode. In terms of its lateral intensity profile, in particular, the pulse is identical to the pulse in the FEL 35.

A controllable grating structure 41, for example with the aid of an acousto-optical element, enables variable power feedback.

Provision can be made for embodying the radiation source 4 in such a way that the FEL 35 can be switched off during operation. This can be done by suppressing the diffraction efficiency into the order of diffraction used for "seeding", in particular into the zero order of diffraction. This can be done for example by switching off the control voltage at the acousto-optical element. This can be achieved in the case of a static grating by displacing or totally removing the grating in or from the beam path. By influencing the amplitude of the grating, it is possible to directly influence the diffraction efficiencies.

By influencing the grating period of the e.g. acousto-optical element, it is possible to control diffraction angles and powers coupled in as a result of overexposure losses at the downstream mirrors and mode mismatch, and the FEL power.

With these measures, on the basis of suitable feedback or feedforward information, it is then possible to realize e.g. dose control at the reticle or wafer level.

The radiation source 4 in accordance with the description above can also be used for a metrology system instead of the projection exposure system 1.

What is claimed is:

1. A radiation source, comprising:
   a free electron laser configured to emit radiation having a wavelength of at most 30 nm; and
   a device configured to feed back the emitted radiation to the free electron laser, the device comprising:
   a first optical component configured to couple out of a beam path the emitted radiation; and
   a second optical component configured to couple into the free electron laser at least a portion of the coupled-out radiation,
   wherein the first optical component comprises a diffractive optical component configured to separate an order of diffraction of the emitted radiation and send the separated order of diffraction of the emitted radiation to the second optical component without sending at least one other order of diffraction to the second optical component, and
   wherein the separated out order of diffraction of the emitted radiation comprises the zeroth diffraction order of the emitted radiation.

2. The radiation source of claim 1, wherein the first optical component comprises a grazing incidence mirror.

3. The radiation source of claim 2, wherein the grazing incidence mirror comprises at least one member selected from the group consisting of silicon carbide (SiC), silicon (Si), copper (Cu), ruthenium (Ru), aluminum (Al), and diamond.

4. The radiation source of claim 2, wherein the second optical component comprises a grazing incidence mirror.

5. The radiation source of claim 1, wherein the second optical component comprises a grazing incidence mirror.

6. The radiation source of claim 5, wherein the grazing incidence mirror comprises at least one member selected from the group consisting of silicon carbide (SiC), silicon (Si), copper (Cu), ruthenium (Ru), aluminum (Al), and diamond.

7. The radiation source of claim 1, wherein the diffractive optical component is drivable.

8. The radiation source of claim 1, wherein the diffractive optical component comprises lines perpendicular to a direction of the radiation incident on the diffractive optical component.

9. The radiation source of claim 1, wherein the diffractive optical component comprises lines parallel to a direction of the radiation incident on the diffractive optical component.

10. The radiation source of claim 1, wherein the diffractive optical component comprises a cooling unit.

11. The radiation source of claim 1, wherein the device comprises two grazing incidence mirrors and two normal incidence mirrors.

12. A method, comprising:
    providing a radiation source according to claim 1;
    using the FEL to generate radiation;
    using the diffractive optical component to separate an order of diffraction of the radiation; and coupling into the FEL at least a portion of the separated order of diffraction of the radiation without coupling into the FEL at least one other order of diffraction of the radiation.

13. The method of claim 12, further comprising driving the diffractive optical component to control the radiation guided to an image field.

14. An illumination system, comprising:
a radiation source according to claim 1,
wherein the illumination system is selected from the group consisting of a microlithographic illumination system and a metrology illumination system.

15. A system, comprising:
an illumination system comprising a radiation source according to claim 1, the illumination system configured to illuminate an object field; and
a projection optical unit configured to image the object field into an image field,
wherein the system is a microlithographic projection exposure system.

16. A method of using a microlithographic projection exposure system comprising an illumination system and a projection optical system, the method comprising:
using the illumination system to illuminate a reticle in an object field with radiation;
using the projection optical system to image the reticle onto a light-sensitive material in an image field,
wherein the illumination system comprises a radiation source according to claim 1.

17. The radiation source of claim 1, wherein the diffractive optical component comprises a blazed grating.

18. The radiation source of claim 1, wherein the diffractive optical component comprises a grating having a line density of at least 30 lines per millimeter.

19. A radiation source, comprising:
a free electron laser configured to emit radiation having a wavelength of at most 30 nm; and
a device configured to feed back the emitted radiation to the free electron laser, the device comprising first, second, third and fourth mirrors,
wherein:
the first mirror comprises a diffractive optical element;
the first mirror is configured to separate an order of diffraction of the emitted radiation and send the separated order of diffraction of the emitted radiation to the second mirror without sending at least one other order of diffraction to the second mirror;
the separated out order of diffraction of the emitted radiation comprises the zeroth diffraction order of the emitted radiation;
the second mirror is configured to reflect at least a portion of the separated order of diffraction of the emitted radiation to the third mirror;
the third mirror is configured to reflect at least a portion of the separated order of diffraction of the emitted radiation to the fourth mirror; and
the fourth mirror is configured to couple into the free electron laser at least a portion of the separated order of diffraction of the emitted radiation.

20. The radiation source of claim 19, wherein:
the first mirror is a grazing incidence mirror;
the second mirror is a normal incidence mirror;
the third mirror is a normal incidence mirror; and
the fourth mirror is a grazing incidence mirror.

21. The radiation source of claim 19, wherein the diffractive optical element is drivable.

* * * * *

UNITED STATES PATENT AND TRADEMARK OFFICE
CERTIFICATE OF CORRECTION

| | | |
|---|---|---|
| PATENT NO. | : 11,303,092 B2 | Page 1 of 1 |
| APPLICATION NO. | : 17/152425 | |
| DATED | : April 12, 2022 | |
| INVENTOR(S) | : Udo Dinger | |

It is certified that error appears in the above-identified patent and that said Letters Patent is hereby corrected as shown below:

In the Specification

Column 5, Line 59, delete "µJ" and insert -- µJ, --.

Signed and Sealed this
Sixteenth Day of August, 2022

Katherine Kelly Vidal
*Director of the United States Patent and Trademark Office*